United States Patent
Wu et al.

(10) Patent No.: US 8,127,979 B1
(45) Date of Patent: Mar. 6, 2012

(54) ELECTROLYTIC DEPOSITON AND VIA FILLING IN CORELESS SUBSTRATE PROCESSING

(75) Inventors: Tao Wu, Chandler, AZ (US); Nicolas R. Watts, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/890,662

(22) Filed: Sep. 25, 2010

(51) Int. Cl.
*B23K 31/02* (2006.01)
*C23D 5/02* (2006.01)

(52) U.S. Cl. .......... 228/180.22; 228/214; 228/215; 205/125

(58) Field of Classification Search .......... None
See application file for complete search history.

(56) References Cited

U.S. PATENT DOCUMENTS

| | | | |
|---|---|---|---|
| 6,858,475 B2 | 2/2005 | Gurumurthy et al. | 438/128 |
| 7,183,653 B2 | 2/2007 | Myers et al. | 257/774 |
| 7,419,850 B2 * | 9/2008 | Chen et al. | 438/106 |
| 7,432,202 B2 | 10/2008 | Saha et al. | 438/686 |
| 7,435,618 B2 * | 10/2008 | Chen et al. | 438/106 |
| 7,538,429 B2 | 5/2009 | Nalla et al. | 257/737 |
| 7,635,641 B2 * | 12/2009 | Hurwitz et al. | 438/612 |
| 7,670,951 B2 | 3/2010 | Toyama et al. | 438/687 |
| 7,851,269 B2 | 12/2010 | Muthukumar et al. | 438/125 |
| 7,888,784 B2 | 2/2011 | Gurumurthy et al. | 257/685 |
| 7,939,373 B2 * | 5/2011 | Usui et al. | 438/108 |
| 7,952,182 B2 | 5/2011 | Watts et al. | 257/686 |
| 7,985,622 B2 | 7/2011 | Nalla et al. | 438/110 |
| 8,013,444 B2 | 9/2011 | Pang et al. | 257/741 |
| 2002/0050591 A1 * | 5/2002 | Tandy | 257/48 |
| 2004/0089470 A1 * | 5/2004 | Shimoto et al. | 174/250 |
| 2004/0140551 A1 * | 7/2004 | Usui et al. | 257/700 |
| 2006/0091023 A1 | 5/2006 | Bukhari et al. | 205/791.5 |
| 2006/0151877 A1 * | 7/2006 | Yamashita et al. | 257/737 |
| 2008/0128916 A1 * | 6/2008 | Soejima et al. | 257/777 |
| 2008/0160751 A1 | 7/2008 | Pang et al. | 438/612 |
| 2009/0001550 A1 | 1/2009 | Li et al. | 257/700 |
| 2009/0166858 A1 | 7/2009 | Bchir et al. | 257/737 |
| 2009/0250824 A1 | 10/2009 | Qi et al. | 257/786 |
| 2009/0314519 A1 | 12/2009 | Soto et al. | 174/250 |
| 2009/0321932 A1 * | 12/2009 | Gonzalez et al. | 257/750 |
| 2010/0155115 A1 | 6/2010 | Pang et al. | 174/257 |
| 2010/0323474 A1 * | 12/2010 | Miyazaki | 438/106 |
| 2011/0147929 A1 * | 6/2011 | Roy et al. | 257/738 |
| 2011/0147933 A1 | 6/2011 | Wu et al. | 257/741 |
| 2011/0215464 A1 | 9/2011 | Guzek et al. | 257/737 |

OTHER PUBLICATIONS

U.S. Appl. No. 12/890,661, filed Sep. 25, 2010, inventors T. Wu and C. Gurumurthy, pp. 1-22.
Presentation (viewgraphs) entitled "PCB Surface Finishes (including the Unleaded Versions)", presented by David Arivett, created by David Hoover, Multek, 2006, pp. 1-54.

* cited by examiner

*Primary Examiner* — Kiley Stoner
(74) *Attorney, Agent, or Firm* — Konrad Raynes & Victor LLP; Alan S. Raynes (57) ABSTRACT

Electronic assemblies including coreless substrates and their manufacture using electrolytic plating, are described. One method includes providing a core comprising a metal, and forming a dielectric material on the core. The method also includes forming vias in the dielectric material, the vias positioned to expose metal regions. The method also performing an electrolytic plating of metal into the vias and on the metal regions, wherein the core is electrically coupled to a power supply during the electrolytic plating of metal into the vias and delivers current to the metal regions. The method also includes removing the metal core after the electrolytic plating of metal into the vias. Other embodiments are described and claimed.

20 Claims, 8 Drawing Sheets

ELECTROLYTIC DEPOSITON AND VIA FILLING IN CORELESS SUBSTRATE PROCESSING

RELATED ART

Integrated circuits may be formed on semiconductor wafers made of materials such as silicon. The semiconductor wafers are processed to form various electronic devices. The wafers are diced into semiconductor chips (a chip is also known as a die), which may then be attached to a substrate using a variety of known methods. The substrate is typically designed to couple the die to a printed circuit board, socket, or other connection. The substrate may also perform one or more other functions, including, but not limited to, protecting, isolating, insulating, and/or thermally controlling the die. The substrate has traditionally been formed from a core made up of a laminated multilayer structure including woven glass layers impregnated with an epoxy resin material. Contact pads and conductive traces are formed on the structure to electrically couple the die to the device to which the package substrate is coupled.

Coreless substrates have been developed to decrease the thickness of the substrate. In a coreless substrate, a removable core layer is typically provided, conductive and dielectric layers built up on the removable core, and then the core is removed. The coreless substrate typically includes a plurality of vias formed therein interlayer electrically connections.

In one type of die attach process, a die is mounted to a substrate using a conventional solder bump array in a flip chip configuration, using a method known as a C4 (controlled collapse chip connection) process, in which solder bumps are located between the die and substrate. In a C4 process, solder may be placed on pads on the active side of the die, on the substrate, or on both the die and substrate, using, for example, stencil mask printing. The solder is then melted and permitted to flow, to ensure that each bump fully wets the pad it was formed on. A second reflow operation is then carried out, and a solder connection is made between the die pads and the substrate pads. The joined package is then cooled to complete the solder bump joint. Solder bump connections may also be made between the package and a printed circuit board such as a motherboard.

A surface finish may be provided on the substrate. The surface finish typically acts to protect the underlying substrate electrical connections until assembly. For example, if the substrate includes copper (Cu) connections, a surface finish may be placed over the copper. If a device is soldered to the substrate, the surface finish may interact with the solder. Alternatively the surface finish may be removed just prior to the soldering operation. Typical surface finishes for protecting copper include nickel/palladium/gold (Ni/Pd/Au) layers and organic solderability preservative (OSP). The nickel palladium gold surface finish includes a layer of nickel on the copper, followed by a layer of palladium on the nickel, followed by a layer of gold on the palladium. The nickel provides a barrier to copper migration and protects the copper surface from oxidation. The palladium acts as an oxidation barrier for the nickel layer. The gold layer acts to improve the wettability during formation of a solder joint. An OSP surface finish typically includes a water-based organic compound that selectively bonds with copper to form an organometallic layer that acts to protect the copper from oxidation.

When using lead free solders to couple the die to the substrate, tin based solders including alloys of tin, silver, and copper (SAC) are commonly used. The surface finish is important to ensure a strong, durable joint. For example, if the surface finish inadequately protects the copper, then oxidation may occur, and the interactions between the oxidized copper and the lead free solder may result in the formation of an unsuitable joint. In addition, depending on the materials used in the surface finish, undesirable reactions may occur that deleteriously affect the properties of the joint.

BRIEF DESCRIPTION OF THE DRAWINGS

Embodiments are described by way of example, with reference to the accompanying drawings, which are not drawn to scale, wherein.

DETAILED DESCRIPTION

A conventional method for filling vias during the fabrication of coreless substrates uses electroless plating to create a layer of Cu as a plating buss for subsequent electrolytic plating. After patterning a photoresist layer on the electrolessly deposited layer to define conductive traces, the via is filled at the same time as the traces are plated by electrolytic Cu plating. The electroless Cu layer (which extends to the edges of the substrate) is electrically coupled to a power source at one of the edges, and acts as a plating buss to supply current for the electrolytic deposition. A conventional method for forming a surface finish on high density pads also uses electroless plating. In electroless plating, no electrical current is used. Metal ions are reduced by chemicals in plating solutions, and the desired metal is deposited on all surfaces. However, as the via size decreases and the dielectric layer thickness increases (changing the aspect ratio of the vias), voids and via recess formation occur during conventional electroless via filling, leading to reliability concerns. In addition, electroless plating generally occurs at a slower rate than electrolytic plating. It is noted that the electrolytically deposited layers are crystalline and generally have a substantially greater density than electrolessly deposited layers. Also, for surface layer formation and subsequent solder joint formation, electroless surface finish plating has been found to have the drawbacks of phosphorus induced solder joint quality concerns, oxidation, and poor corrosion resistance.

Certain embodiments relate to the formation of coreless substrates in which vias are filled using an electrolytic plating process without a first electroless plating operation as in a conventional process. An electrolytic plating process utilizes an electrical current passed through a solution contained dissolved metal ions, with the ions attracted to the charged metal surface to be deposited on. Certain embodiments utilize a method in which the temporary substrate core may serve as a plating buss and then vias filled using an electrolytic process.

Figure 1A:
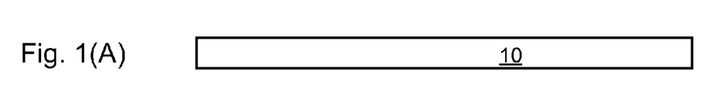
FIGS. 1(A)-1(U) illustrate views of processing operations for forming a coreless substrate, in accordance with certain embodiments.
Figure 1B:
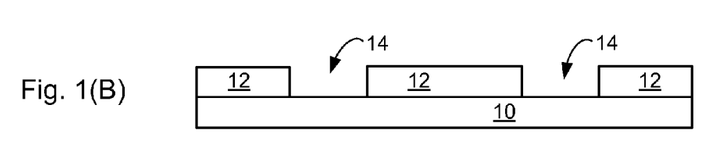
Figure 1C:
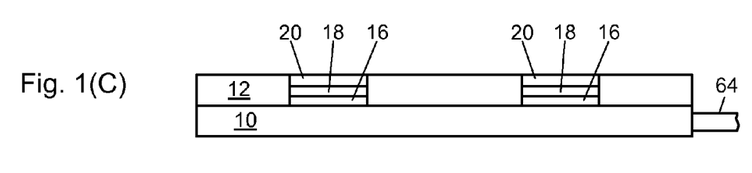
Figure 1D:
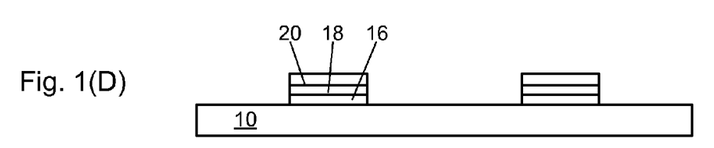
Figure 1E:
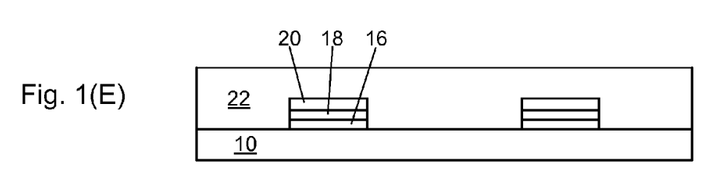
Figure 1F:
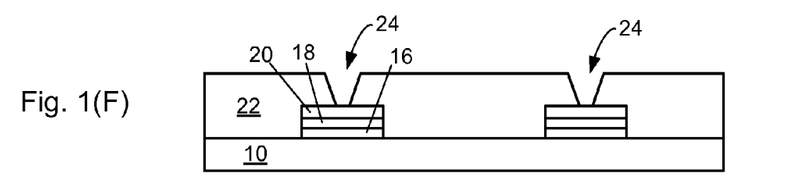
Figure 1G:
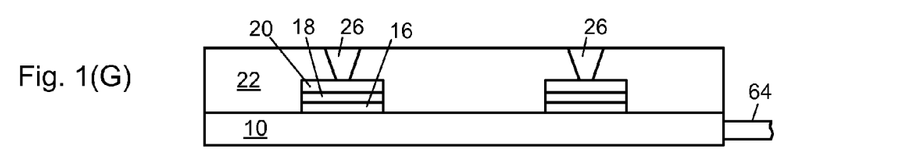
Figure 1H:
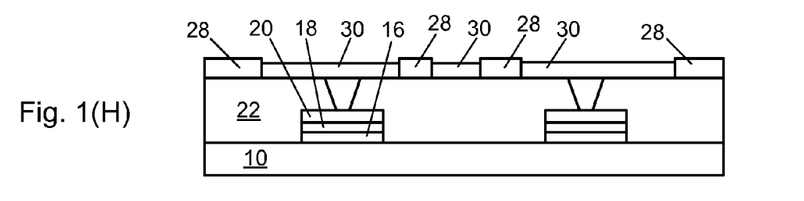
Figure 1I:
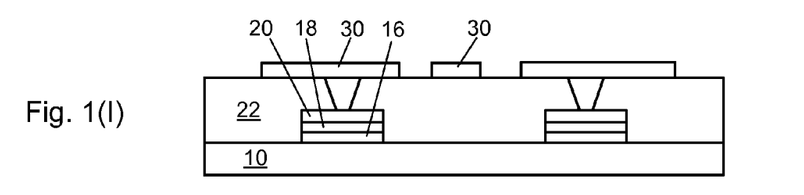
Figure 1J:
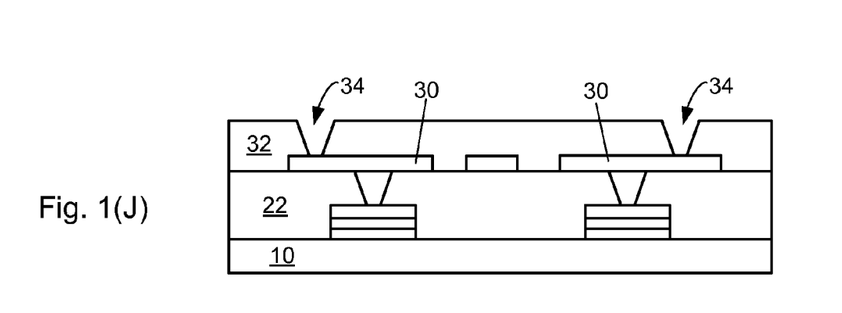
Figure 1K:
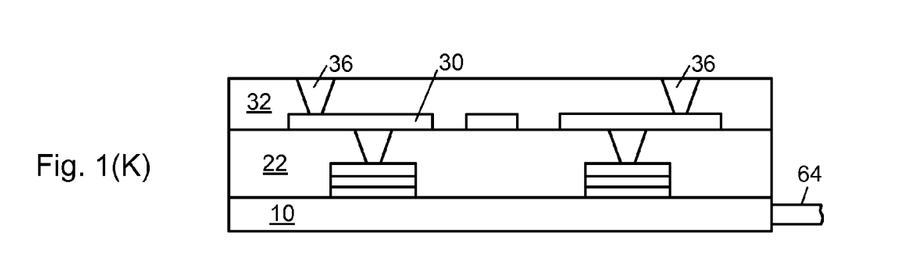
Figure 1L:
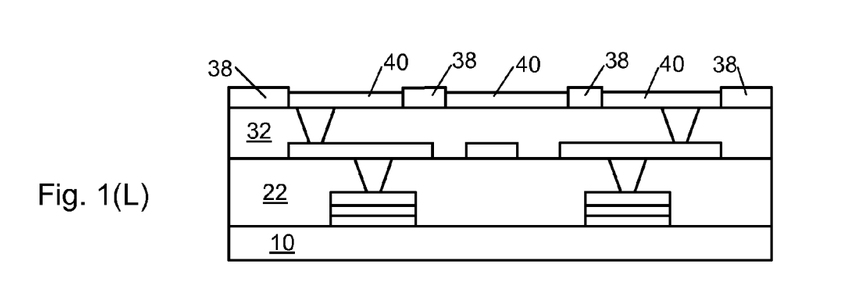
Figure 1M:
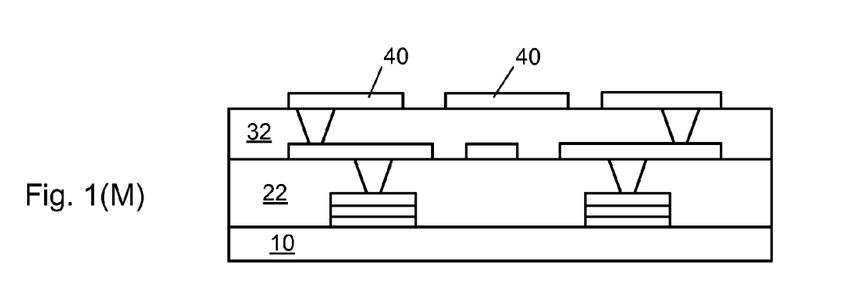
Figure 1N:
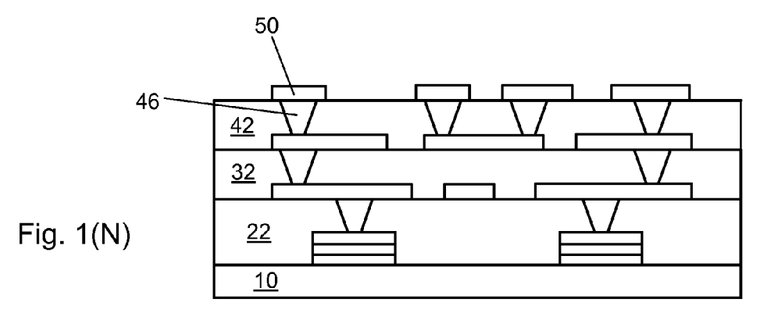
Figure 1O:
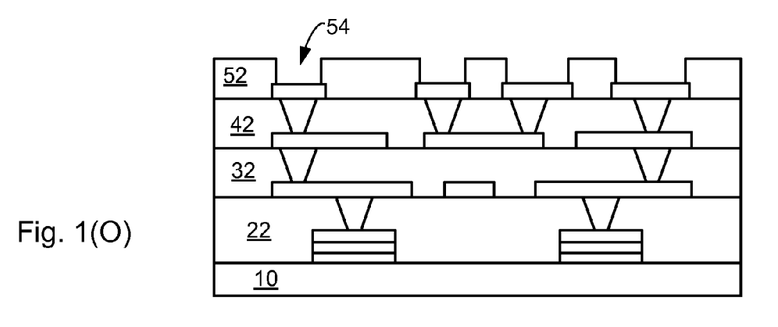
Figure 1P:
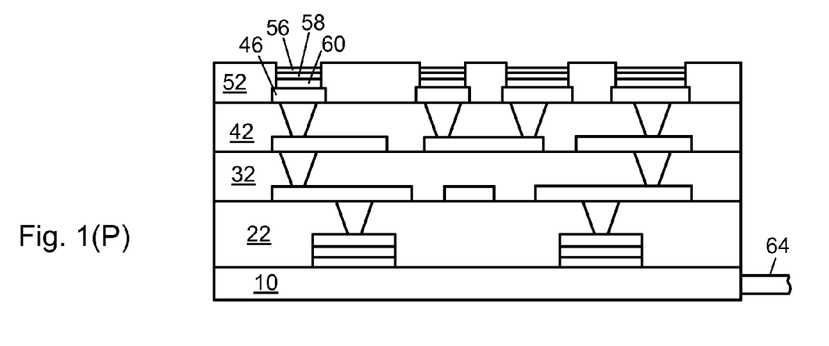
Figure 1Q:
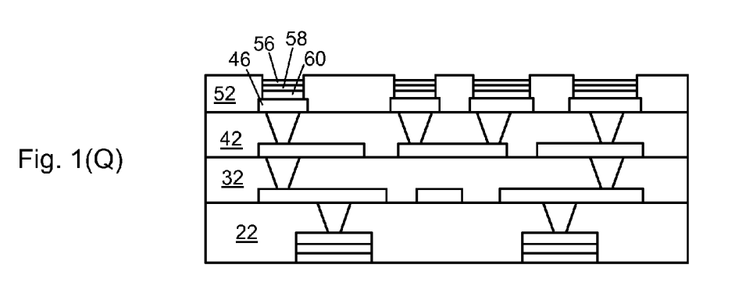
Figure 1R:
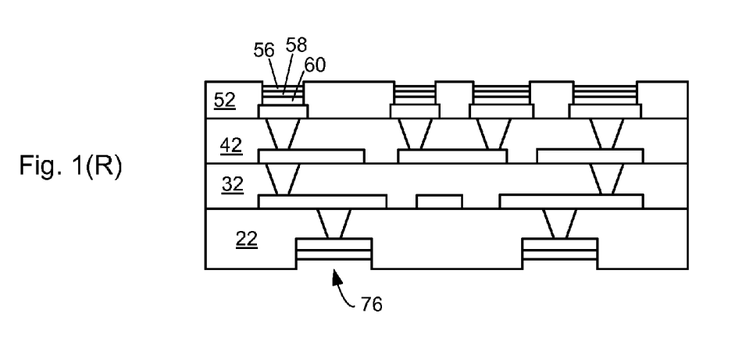
Figure 1S:
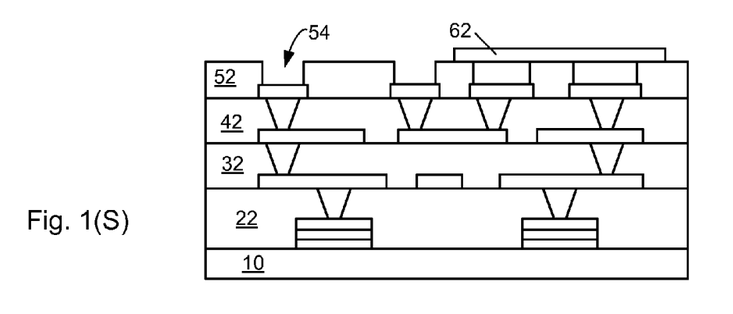
Figure 1T:
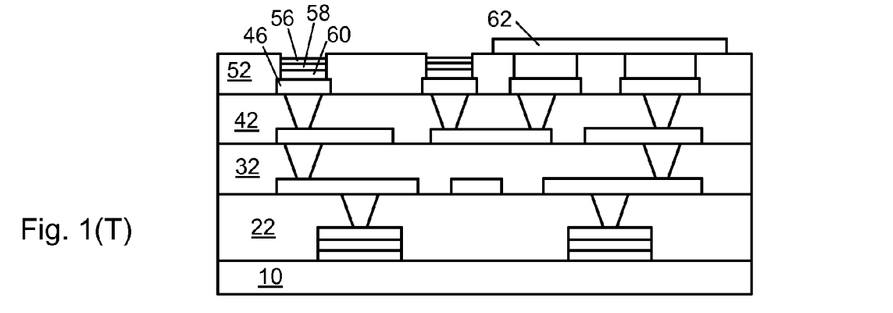
Figure 1U:
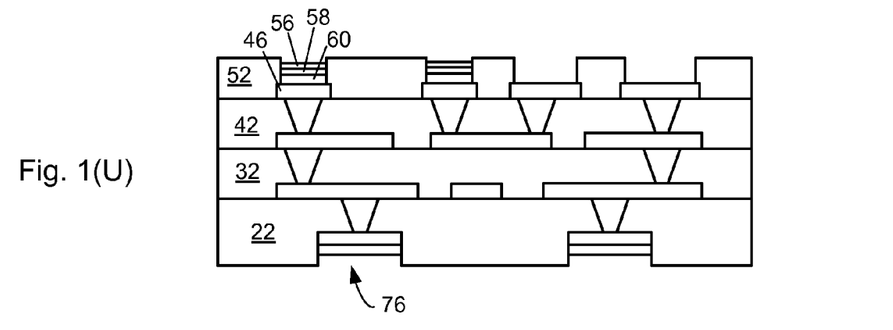

FIGS. 1(A)-1(U) illustrate operations for forming a coreless substrate in accordance with certain embodiments. As seen in FIG. 1(A), a temporary substrate core 10 is provided. The core 10 may be formed from, for example, a metal such as copper. FIG. 1(B) illustrates the formation of a patterned resist layer 12 having an opening 14 therein that exposes the core 10. A number of layers may then be deposited on the core 10, within the openings 14, as illustrated in FIG. 1(C). A first copper layer 16 may be electrolytically plated on the core This copper layer 16 may be removed later in the process, so that a recess may be formed on the surface of the substrate. A surface finish layer 18 may then be electrolytically plated onto the first copper layer 16. One example of a surface finish layer 18 includes sublayers of gold, palladium, and nickel. Then a second copper layer 20 may be electrolytically plated onto the surface finish layer 18. The temporary core 10 may be connected to a power supply through connection 64 and serve as all or a portion of the plating buss for the electrolytic deposition. The plating buss refers to the structure used to deliver current to an area to be plated. In one aspect of various embodiments described herein, the core acts as at least part of a plating buss during the electrolytic plating operation.

Next, as seen in FIG. 1(D), the patterned resist 12 is removed. A dielectric layer 22 is formed over the core 10 and electrolytically plated layers 16, 18, 20 as illustrated in FIG. 1(E). The dielectric layer 22 may be formed using a build up process with a material such as, for example, a polymer. One example of a suitable material is a polymeric epoxy film known as Aginomoto Build-up Film (ABF), available from Ajinomoto Fine-Techno Company, Inc. Vias 24 may be formed in the dielectric layer 22, to expose the second copper layer 22, as illustrated in FIG. 1(F). The vias may be formed using any suitable technique, for example, laser drilling.

The vias 24 may be filled with a material (for example, copper) to form filled vias 26, using electrolytic deposition. As illustrated in FIG. 1(G), the temporary core 10 may be electrically coupled to a power supply through connection 64. The bottom surface defining the via is copper layer 20, which is electrically coupled to the temporary core 10 through the layers 18 and 16. The via 24 may be filled with electrolytically plated material onto the copper layer 20.

In accordance with certain embodiments, once the vias 24 are filled, a thin metal layer 30 may be electrolessly deposited on the surface of the dielectric layer 22 and the filled via 24 surface. A photoresist layer (e.g. dry film resist) may be formed and patterned to define openings that expose regions where conductive traces will be formed. Then electrolytic deposition may be carried out to form the conductive traces 30, as illustrated in FIG. 1(H). The traces 30 may include a thin layer of electrolessly deposited metal, and a thicker layer of electrolytically deposited metal. The electrolytic deposition for the traces may be carried out using the electrolessly deposited metal coupled to a power supply to provide the current for the electrolytic plating (as described in the first paragraph of the Detailed Decriptor above) or may use the core 10 coupled to a power supply in order to supply the current for the electrolytic plating. The photoresist layer 30 may then be removed, as illustrated in FIG. 1(I). Operations such as surface roughening, for example, using a conventional process known as a CZ process, and a flash etch, to remove underlying electrolessly deposited metal, may also be carried out.

As illustrated in FIG. 1(J), another dielectric layer 32 (for example, ABF) may be deposited and vias 34 formed. The vias 34 may be filled to form filled vias 36 using electrolytic plating as described above, with the electrical connection including a path made through the trace layer 30, the filled vias 24, the electrolytically deposited layer 20, 18, 16, and the temporary core 10 that is coupled to a power supply during the plating operation through connection 64, as illustrated in FIG. 1(K).

Traces 40 maybe formed in the same manner as traces 30 as described above, including the formation of patterned photo-resist 38, as illustrated in FIG. 1(L). The patterned photoresist 38 may be removed and the other operations such as surface roughening and flash etching, carried out as described above, yielding the structure illustrated in FIG. 1(M). If desired, additional layers of dielectric material, vias, and traces may be formed in the manner as described above. FIG. 1(N) illustrates an additional dielectric layer 42, having electrolytically filled vias 46 with conductive trace regions 50 formed thereon.

As illustrated in FIG. 1(O), another layer of dielectric material 52 may be formed on the structure. This dielectric material may in certain embodiments be a solder resist material to be used on a surface of the substrate. The dielectric material 52, when formed from a resist material, may be patterned to form openings 54, as illustrated in FIG. 1(O). A number of layers may be electrolytically formed in the openings 54. Such layers may include, for example, various layers or sublayers used in a suitable surface finish. As illustrated in FIG. 1(P), one example includes electrolytically deposited layers of nickel (Ni) 60, palladium (Pa) 58, and gold (Au) 56. Numerous other surface finish materials may also be used. In certain embodiments, after the core is removed, the uppermost layer 56 illustrated in has an exposed surface that may be brought into direct contact with a solder connection such as a solder bump, then heated to reflow the solder, in order to form a solder contact to a device including, but not limited to, a semiconductor die.

As illustrated in FIG. 1(Q), the temporary core 10 may be removed, yielding a coreless substrate. The temporary core 10 may be removed using any suitable method, including, but not limited to, etching. The first copper layer 16 that was deposited on the temporary core 10 may also be removed, leaving recesses 76 on the lower surface as illustrated in FIG. 1(R). The recessed surface may be useful, for example, as a receiving space for a contact pad or solder bump.

In certain embodiments, it is useful to be able to have a surface finish that is different in different regions of the substrate. This may be achieved by utilizing a protective film that is compatible with the electrolytic deposition process. As illustrated in FIG. 1(S), a protective film 62 (for example, a polymeric film including, but not limited to, a photoresist film), is formed over part of the substrate. As seen in FIG. 1(S), the two openings 54 on the right side of the substrate are covered by the film 62 and the two on the left side are not covered. Electrolytic deposition may then be carried out to form the layers 60, 58, and 56, as illustrated in FIG. 1(T).

As illustrated in FIG. 1(U), the temporary core 10 (which was used as the plating buss during electrolytic deposition) and the protective film 62 may then be removed, yielding a substrate having a different surface finish in different surface regions.

It has been found that electrolytic deposition of the surface finish (such as layers 56, 58, 60) provides better oxidation resistance and solder joint reliability than electrolessly deposited layers.

Figure 2:
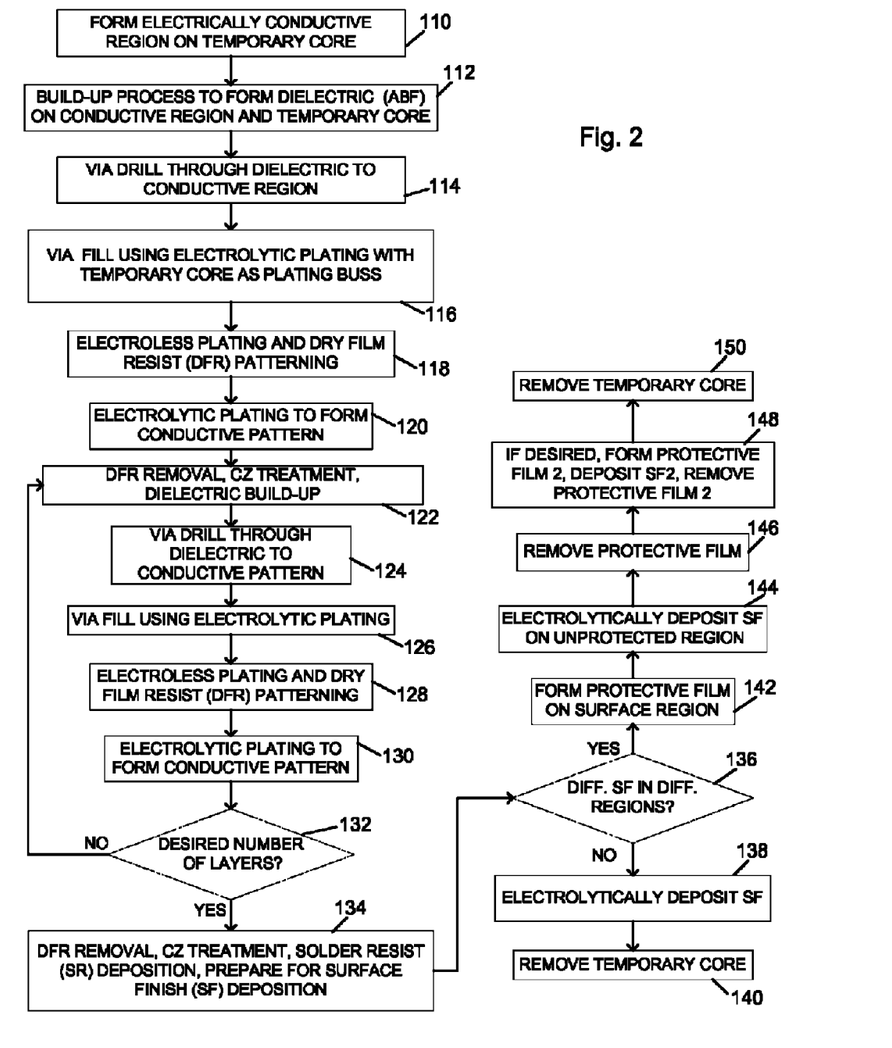
FIG. 2 illustrates a flow chart of process operations for forming a coreless substrate, in accordance with certain embodiments.

FIG. 2 illustrates a flowchart of operations, in accordance with certain embodiments. Box 110 is forming an electrically conductive region on a temporary core. The temporary core may comprise a metal such as, for example, copper. Box 112 is forming a dielectric layer such as ABF on the conductive region and temporary core. Box 114 is via formation by drilling through the dielectric layer (ABF) to reach the conducive region. Box 116 is via filling using the temporary core coupled to a power source to supply to supply current to perform electrolytic plating. Box 118 is electroless plating and dry film resist (DFR) patterning. Box 120 is electrolytic plating to complete the formation of the conductive pattern (traces). Box 122 is the removal of the dry film resist, surface roughening treatment (CZ), and formation of another dielectric layer (ABF) using a build-up process. Box 124 is via formation by drilling through the dielectric layer (ABF) to reach the conductive pattern. Box 126 is via filling using electrolytic plating, as in Box 116. Box 128 is electroless plating and dry film resist (DFR) patterning. Box 130 is electrolytic plating to complete the formation of another layer of the conductive pattern.

Box 132 is determining whether a desired number of layers of vias and conductive patterns have been achieved. If not, then go back to Box 124 and proceed with formation of additional layers. If yes, then go to Box 134, which is dry film resist removal, surface treatment (CZ), and deposition of solder resist. The solder resist may be formed and patterned to leave openings into which surface finish metal layers may be deposited.

Box 136 is determining whether a different surface finish is needed in different regions of the surface of the substrate. For certain types of connections, for example, certain C4 connections, different surface finishes in different regions may be useful.

If the answer to Box 136 is no, then the surface finish is then deposited in the openings in the solder resist as per Box 138, using electrolytic plating. Then, after the electrolytic plating is complete, the temporary core can be removed, as indicated in Box 140. If the answer to Box 136 is yes, then proceed to Box 142 and from a protective film on the surface in the appropriate locations. Box 144 is electrolytically depositing the surface finish metal layers in the openings in the solder resist. Box 146 is removing the protective film, which may be carried out using a suitable heating or etching operation. Box 148 is forming an additional protective film (protective film 2), if desired, so that deposition of a second surface finish (SF2) can be carried out using electrolytic deposition. Then, the second protective film is removed. Box 150 is removing the temporary core. It should be appreciated that various additions and/or modifications may be made to the above operations described in connection with FIG. 2, within the scope of various embodiments. In addition, certain embodiments may relate to a subset of the operations specified in FIG. 2, independent of other operations specified in FIG. 2.

Figure 3:
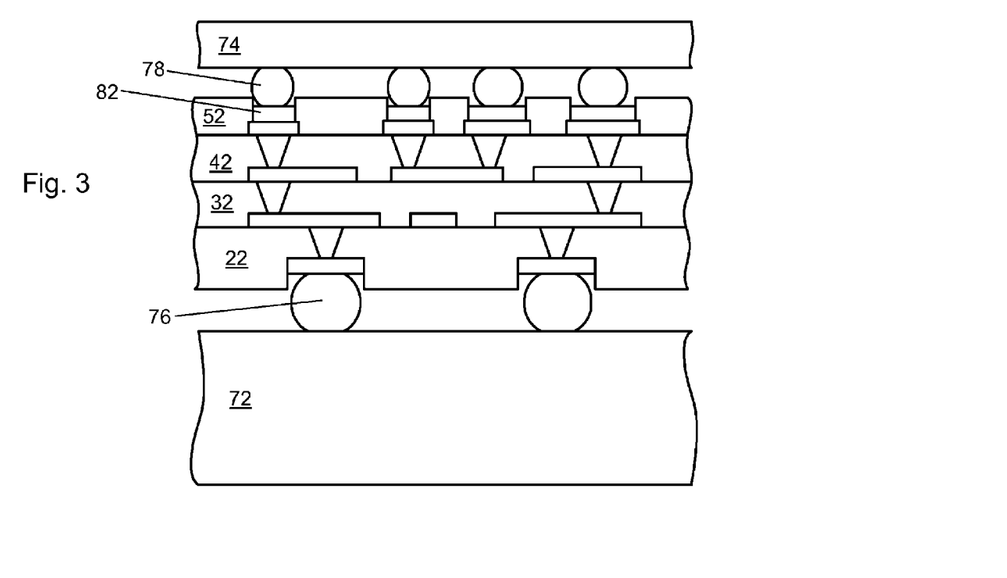
FIG. 3 illustrates a cross-sectional view of an assembly including a coreless substrate coupled to a die and a board, in accordance with certain embodiments.

FIG. 3 is illustrates a portion of an assembly in accordance with certain embodiments, including a coreless substrate coupled to a die 74 through solder connections 78 on one side, and coupled to a board 72 through solder connections 76 on the other side. The substrate includes a number of levels of vias and wiring traces (patterns) within its thickness. The substrate corresponds to the substrate illustrated in FIG. 1(R), after being coupled to the die 74 and to the board 72. The vias were filled with electrolytically plated metal, for example, copper, formed using the core 10 (since removed) coupled to a power supply to deliver current for the plating operation. The solder connections 76, 78 may be made using a lead free solder such as, for example, an SAC (tin/silver/copper) solder. In this embodiment, at least part of the surface finish on the upper and lower surfaces has reacted with the solder and as a result, the area at and near the interface solder connections on the substrate may include reaction products such as alloys and intermetallics formed from various combinations of metals including, for example, tin, silver, copper, nickel, palladium, and gold.

Figure 4:
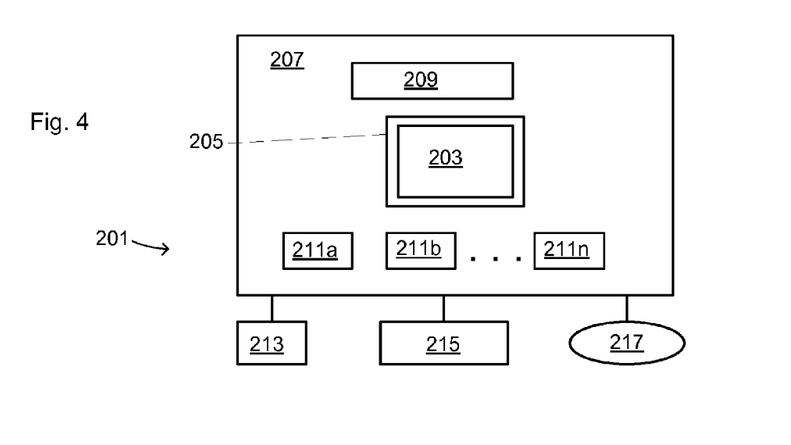
FIG. 4 illustrates an electronic system arrangement in which embodiments may find application.

Assemblies including components formed as described in embodiments above may find application in a variety of electronic components. FIG. 4 schematically illustrates one example of an electronic system environment in which aspects of described embodiments may be embodied. Other embodiments need not include all of the features specified in FIG. 4, and may include alternative features not specified in FIG. 4.

The system 201 of FIG. 4 may include at least one central processing unit (CPU) 203. The CPU 203, also referred to as a microprocessor, may be a die which is attached to an integrated circuit package substrate 205, which is then coupled to a printed circuit board 207, which in this embodiment, may be a motherboard. The CPU 203 and package substrate 205 coupled to the board 207 is an example of an electronic device assembly that may be formed in accordance with embodiments such as described above. A variety of other system components, including, but not limited to memory and other components discussed below, may also include structures formed in accordance with the embodiments described above.

The system 201 may further include memory 209 and one or more controllers 211*a*, 211*b* . . . 211*n*, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211*a*, 211*b* . . . 211*n* may be disposed on other cards such as daughter cards or expansion cards. The CPU 203, memory 209 and controllers 211*a*, 211*b* . . . 211*n* may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 211*a*, 211*b* . . . 211*n* may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

The terms "a" and "an" as used herein denote the presence of at least one of the referenced item, and do not denote a limitation of quantity. In addition, terms such as "first", "second", and the like as used herein to not necessarily denote any particular order, quantity, or importance, but are used to distinguish one element from another.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
   providing a core comprising a metal;
   forming a dielectric material on the core;
   forming vias in the dielectric material, the vias positioned to expose metal regions;
   performing an electrolytic plating of metal into the vias and on the metal regions, wherein the core is electrically coupled to a power supply during the electrolytic plating of metal into the vias and delivers current to the metal regions;
   removing the metal core after the electrolytic plating of metal into the vias; and
   prior to the forming a dielectric material on the core;
      forming a patterned photoresist layer on the metal core;
      performing an electrolytic plating of at least one metal layer in an opening in the patterned photoresist layer, wherein the core is electrically coupled to a power supply during the electrolytic plating of the at least one metal layer in the opening and delivers current to the at least one metal layer in the opening; and
      removing the patterned photoresist layer;
   wherein the forming a dielectric material on the core includes positioning the dielectric material on the core and on the at least one metal layer.

2. A method comprising:
   providing a core comprising a metal;
   forming a dielectric material on the core;
   forming vias in the dielectric material, the vias positioned to expose metal regions;
   performing an electrolytic plating of metal into the vias and on the metal regions, wherein the core is electrically coupled to a power supply during the electrolytic plating of metal into the vias and delivers current to the metal regions;
   removing the metal core after the electrolytic plating of metal into the vias;
   performing an electroless plating of a layer of metal on the dielectric layer and on the metal in the vias;
   forming a patterned resist layer on the electroless plated layer of metal to define regions for electrically conductive traces; and
   performing an electrolytic plating of metal on the regions for electrically conductive traces, to form electrically conductive traces.

3. The method of claim 2, further comprising:
   forming an additional dielectric layer on the electrically conductive traces and on the dielectric layer;
   forming additional vias in the additional dielectric layer; the additional vias positioned to contact underlying metal from the electrically conductive traces; and
   performing an electrolytic plating of metal on the underlying metal in the additional vias, wherein the core is electrically coupled to a power supply during the electrolytic plating of the metal on the underlying metal and delivers current to the underlying metal.

4. The method of claim 3, further comprising:
   performing an additional electroless plating of an additional layer of metal on the additional dielectric layer and on the electrolytically plated metal on the underlying metal in the additional vias;
   forming a patterned resist layer on the electrolessly plated additional layer of metal to define regions for additional electrically conductive traces; and
   performing an electrolytic plating of metal on the regions for additional electrically conductive traces, to form additional electrically conductive traces.

5. The method of claim 4, further comprising forming a patterned solder resist layer on the additional electrically conductive traces and the additional dielectric layer, the patterned solder resist layer including openings therein.

6. The method of claim 5, wherein the openings in the patterned solder resist layer expose portions of the additional electrically conductive traces, and performing an electrolytic plating of metal on the exposed portions of the additional electrically conductive traces to form a surface finish, wherein the core is electrically coupled to a power supply during the electrolytic plating of the metal on the exposed portions of the additional electrically conductive traces and delivers current to the exposed portions.

7. The method of claim 6, wherein the core is removed after the electrolytic plating of metal in the openings to form the surface finish.

8. A method comprising:
   providing a core comprising a metal;
   forming a dielectric material on the core;
   forming vias in the dielectric material, the vias positioned to expose metal regions;
   performing an electrolytic plating of a metal on the metal regions in the vias;
   wherein the core is coupled to a power supply and delivers current during the electrolytic plating of the metal on the metal regions in the vias;
   wherein the core is used as a plating buss during the electrolytic plating of the metal on the metal regions in the via;
   forming electrically conductive traces on the dielectric material and the electrolytically plated metal in the vias after the electrolytic deposition of the metal into the vias;
   forming a solder resist layer on the electrically conductive traces and providing openings in the solder resist layer, the openings exposing additional metal regions;
   forming a metal surface finish by electrolytically plating metal on the additional metal regions in the openings in the solder resist layer, wherein the core is coupled to a power supply during the electrolytic plating of the metal on the additional metal regions in the openings and delivers current to the additional metal regions;
   removing the core after the electrolytic plating of the metal on the additional metal regions; and
   prior to the forming the metal surface finish, forming a protective layer over at least one of the openings in the solder resist layer, wherein the protective layer is formed from a material that will not be plated with metal during an electrolytic plating process.

9. The method of claim 8, further comprising, after the forming the metal surface finish, removing the protective layer.

10. The method of claim 8, further comprising, after the removing the protective layer, and prior to the removing the core, forming an additional protective layer to cover at least some of the openings in the solder resist layer that were not covered by the previously formed protective layer.

11. The method of claim 10, further comprising electrolytically plating metal on the additional metal regions in the openings in the solder resist layer that are not covered by the additional protective layer, wherein the core is coupled to a power supply during the electrolytic plating of the metal on the additional metal regions in the openings that are not covered by the additional protective layer and delivers current to the additional metal regions.

12. The method of claim 1, further comprising:
performing an electroless plating of a layer of metal on the dielectric layer and on the metal in the vias;
forming a patterned resist layer on the electroless plated layer of metal to define regions for electrically conductive traces; and
performing an electrolytic plating of metal on the regions for electrically conductive traces, to form electrically conductive traces.

13. The method of claim 12, further comprising:
forming an additional dielectric layer on the electrically conductive traces and on the dielectric layer;
forming additional vias in the additional dielectric layer; the additional vias positioned to contact underlying metal from the electrically conductive traces; and
performing an electrolytic plating of metal on the underlying metal in the additional vias, wherein the core is electrically coupled to a power supply during the electrolytic plating of the metal on the underlying metal and delivers current to the underlying metal.

14. The method of claim 13, further comprising:
performing an additional electroless plating of an additional layer of metal on the additional dielectric layer and on the electrolytically plated metal on the underlying metal in the additional vias;
forming a patterned resist layer on the electrolessly plated additional layer of metal to define regions for additional electrically conductive traces; and
performing an electrolytic plating of metal on the regions for additional electrically conductive traces, to form additional electrically conductive traces.

15. The method of claim 14, further comprising forming a patterned solder resist layer on the additional electrically conductive traces and the additional dielectric layer, the patterned solder resist layer including openings therein.

16. The method of claim 15, wherein the openings in the patterned solder resist layer expose portions of the additional electrically conductive traces, and performing an electrolytic plating of metal on the exposed portions of the additional electrically conductive traces to form a surface finish, wherein the core is electrically coupled to a power supply during the electrolytic plating of the metal on the exposed portions of the additional electrically conductive traces and delivers current to the exposed portions.

17. The method of claim 16, wherein the core is removed after the electrolytic plating of metal in the openings to form the surface finish.

18. The method of claim 17, wherein a coreless substrate remains after the core is removed, the method further comprising:
coupling a die to the coreless substrate through a first group of solder bumps by positioning the first group of solder bumps on the surface finish and forming a solder joint; and
coupling the coreless substrate to a board through a second group of solder bumps;
wherein the coreless substrate is positioned between the board and the die.

19. The method of claim 7, wherein a coreless substrate remains after the core is removed, and further comprising coupling the coreless substrate to a die through solder bumps by positioning the solder bumps on the surface finish and forming a solder joint.

20. The method of claim 19, further comprising coupling the coreless substrate to a board using additional solder bumps, wherein the coreless substrate is positioned between the board and the die.

* * * * *